United States Patent

Warring et al.

[11] Patent Number: 5,841,787
[45] Date of Patent: Nov. 24, 1998

[54] MEMORY PROGRAMMING AND TEST CIRCUITRY AND METHODS FOR IMPLEMENTING THE SAME

[75] Inventors: Khushwinder S. Warring, Phoenix; David K. Skaare, Chandler, both of Ariz.

[73] Assignee: VLSI Technology, Inc., San Jose, Calif.

[21] Appl. No.: 975,598

[22] Filed: Nov. 21, 1997

[51] Int. Cl.$^6$ ...................................................... G06F 11/00
[52] U.S. Cl. .............................................................. 371/21.1
[58] Field of Search ................................. 371/21.1, 22.1, 371/22.2, 22.5, 22.6, 28; 364/578, 488, 713

[56] References Cited

U.S. PATENT DOCUMENTS 5,432,722  7/1995  Guilfoyle et al. ....................... 364/713
5,553,008  9/1996  Huang et al. ............................. 364/578

Primary Examiner—Vincent P. Canney
Attorney, Agent, or Firm—Hickman & Martine, LLP

[57] ABSTRACT

Disclosed is a loadboard that includes a plurality of channel pins that are arranged on the loadboard. The plurality of channel pins are electrically routed on the loadboard to a receptacle that is configured to receive I/O pins of an integrated circuit chip. The loadboard further includes a programming and test circuit that is integrated on the loadboard, and is coupled to a set of the plurality of channel pins to enable communication with the integrated circuit chip. The programming and test circuit includes a programming sub-circuit for communicating a plurality of voltage levels set by a programming vector to the integrated circuit chip, and a bias sub-circuit for communicating a plurality of bias voltage levels set by the programming vector to the integrated circuit chip.

23 Claims, 8 Drawing Sheets

| Programming | Vector | | |
|---|---|---|---|
| C2/C5 | C3/C6 | Difference | Output (Co/C1) |
| (1-High) 7V | (1-High) 6V | 1V | 2V |
| (0-Low) 4V | (0-Low) 2V | 2V | 4V |
| (1-High) 7V | (0-Low) 2V | 5V | 10V |
| X | X | 0V | 0V |
| X | X | 0V | 0V |
| (1-High) 7.5V | (1-High) 7V | 0.5V | 1V (Test Pulse) |

FIG. 5

MEMORY PROGRAMMING AND TEST CIRCUITRY AND METHODS FOR IMPLEMENTING THE SAME

BACKGROUND OF THE INVENTION

1. Field of the Invention

The present invention relates generally to integrated circuits and, more particularly, to methods and apparatus for programming and testing memory devices.

2. Description of the Related Art

Recently, one-time programmable memory devices have been receiving increased popularity. Common one-time programmable memory devices are made up of an array of antifuse cells (i.e., a via-link ROM (vROM)) that may be addressed and programmed. Generally, an antifuse cell is has a top metallization conductor that sandwiches an amorphous silicon material with a bottom metallization conductor. In its un-programmed state, no current will flow through the amorphous silicon material (i.e., due to its high resistance). To program an antifuse cell, a programming voltage is applied between the top metallization conductor and the bottom metallization conductor which causes a conductive filament to form in the amorphous silicon material. Once programmed, the antifuse cell will allow current to pass between the top metallization conductor and the bottom metallization conductor.

Conventionally, vROM chips are programmed in programming stations where a known programming vector is applied to cause a programming of selected antifuse cells. Once the desired antifuse cells have been programmed, the vROM chip is inserted into a loadboard where tests are performed to determine whether the programming was successful. If particular antifuse cells were not adequately programmed, the testing on the loadboard would be able to detect the programming errors.

FIG. 1A shows a conventional loadboard testing system 100 for testing a chip 108. As show, a loadboard 106 is in the form of a panel that has many routing lines to enable interconnection to selected pins of the chip 108. Thus, when the chip 108 is inserted into the loadboard 106, the pins of the chip 108 will be electrically connected to a test head 102. As is well known, the test head 102 has logic circuitry that is well suited to communicate the testing vectors to the chip 108 and then back to a test station 104. Although this testing arrangement works well in applications where the programming vector is known, the testing arrangement may not work in security chip programming.

FIG. 1B is a simplified top view of a security chip 108' that has an internal program processor 107 that randomly programs data into a vROM array 109. An example of internal program processors 107 may be an ARM™ processor, that is available from Advanced RISC Machines, Ltd., of Cherry Hinton, Cambridge, U.K. The internal program processor is generally configured to randomly program links so that a security chip may not be reverse engineered. In some applications, a vROM 109 serves as a key that enables or disables access to an application specific integrated circuit (ASIC) 110.

Although vROM 109 is well suited to prevent access to confidential information, conventional testing of the vROM 109 may not be performed on the loadboard 106 because the test system 104 does not know what the cell addresses programmed by the programming vector are. Consequently, there may be cases where the vROM 109 will have particular antifuse cells that were not properly programmed, and there is no way to know of such programming failures until an entire device fails to operate. Thus, there may also be cases where the security chip 108' was programmed correctly, but then becomes un-programmed when a filament of a particular antifuse cell fails to conduct sufficient current.

In view of the foregoing, there is a need for a method and apparatus for programming memory cells of an integrated circuit chip, and simultaneously testing the programming of the memory cells to determine programming integrity.

SUMMARY OF THE INVENTION

Broadly speaking, the present invention fills these needs by providing a method and apparatus for simultaneously programming and testing memory cells of an integrated circuit chip through logic circuitry that is integrated onto a loadboard. It should be appreciated that the present invention can be implemented in numerous ways, including as a process, an apparatus, a system, a device, or a method. Several inventive embodiments of the present invention are described below.

In one embodiment, a loadboard having a plurality of channel pins that are arranged on the loadboard is disclosed. The plurality of channel pins are electrically routed on the loadboard to a receptacle that is configured to receive I/O pins of an integrated circuit chip. The loadboard further includes a programming and test circuit that is integrated on the loadboard, and is coupled to a set of the plurality of channel pins to enable communication with the integrated circuit chip. The programming and test circuit includes a programming sub-circuit for communicating a plurality of voltage levels set by a programming vector to the integrated circuit chip, and a bias sub-circuit for communicating a plurality of bias voltage levels set by the programming vector to the integrated circuit chip.

In another embodiment, a method for making a loadboard is disclosed. The method includes providing a chip having memory cells that are to be programmed and tested on the loadboard. The method further includes integrating a programming and test circuit into the loadboard. The programming and test circuit is configured to communicate a programming vector to a selected one of the memory cells of the chip, and testing the selected one of the memory cells while it is still selected. The testing is configured measure whether a suitable current flow occurs through the selected one of the memory cells.

In yet another embodiment, a vROM programming and testing system is disclosed. The system includes a loadboard having a receptacle for receiving a chip having vROM memory cells. A test head is configured to electrically couple to the loadboard. The system further includes a programming and test circuit that is integrated on the loadboard. The programming and test circuit includes a programming sub-circuit and a biasing sub-circuit. Whereby the test head transfers a programming vector to the programming and test circuit of the loadboard so that a selected cell of the vROM memory cells is programmed and tested before a next cell of the vROM memory cells is selected.

One advantage of the present invention is that security chips may now be programmed and tested at the same time on a single loadboard. Further, the substantially simultaneous programming and testing enable testing of security chips that have internal random addressing processors. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIG. 5 is a table having programming voltages that are defined by a programming vector in accordance with one embodiment of the present invention.

DETAILED DESCRIPTION OF THE PREFERRED EMBODIMENTS

An invention for methods and apparatus for simultaneously programming and testing memory cells of an integrated circuit chip through logic circuitry that is integrated onto a loadboard is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
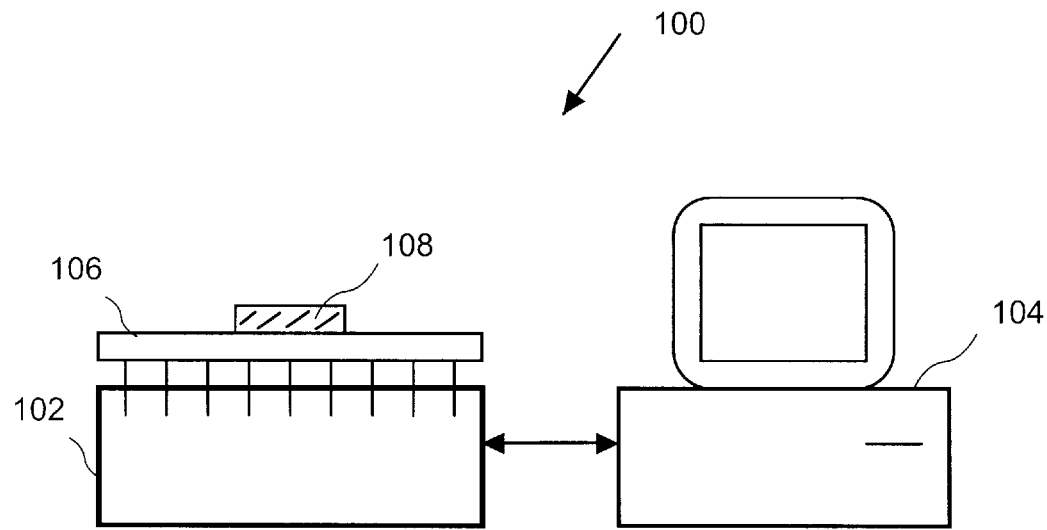
FIG. 1A shows a conventional loadboard for testing a chip.
Figure 1B:
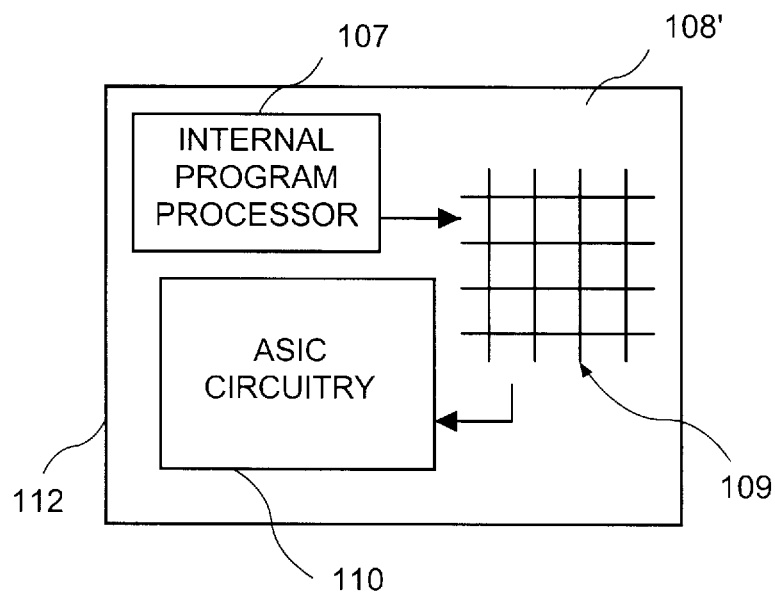
FIG. 1B is a simplified top view of a security chip that has an internal program processor for addressing cells to program in a memory device.
Figure 2:
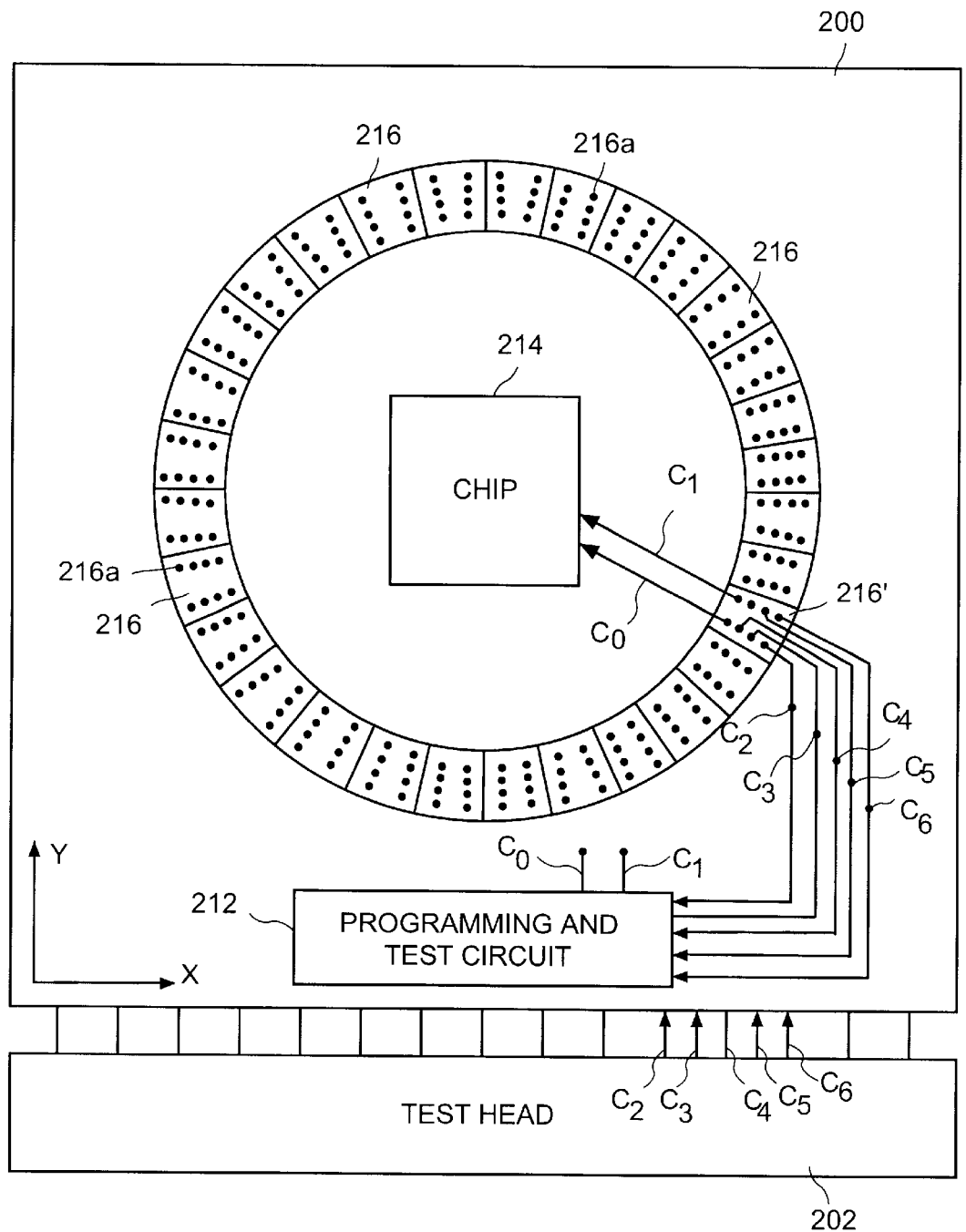
FIG. 2 shows a top view of a loadboard that is coupled to a test head in accordance with one embodiment of the present invention.

FIG. 2 shows a top view of a loadboard 200 that is coupled to a test head 202 in accordance with one embodiment of the present invention. In this example, the loadboard 200 includes a circular array of pin cards 216, where each pin card 216 has eight pins 216a that are routed to a chip 214. To mount the chip 214 onto the loadboard 200, a chip receptacle is built into the loadboard 200, such that input/output (I/O) pins (not shown) of the chip 214 can make suitable electrical contact with conductive routing traces of the loadboard 200. In this manner, each of the eight pins 216a of the pin cards 216 are associated with a particular I/O pin of the chip 214.

Figure 3:
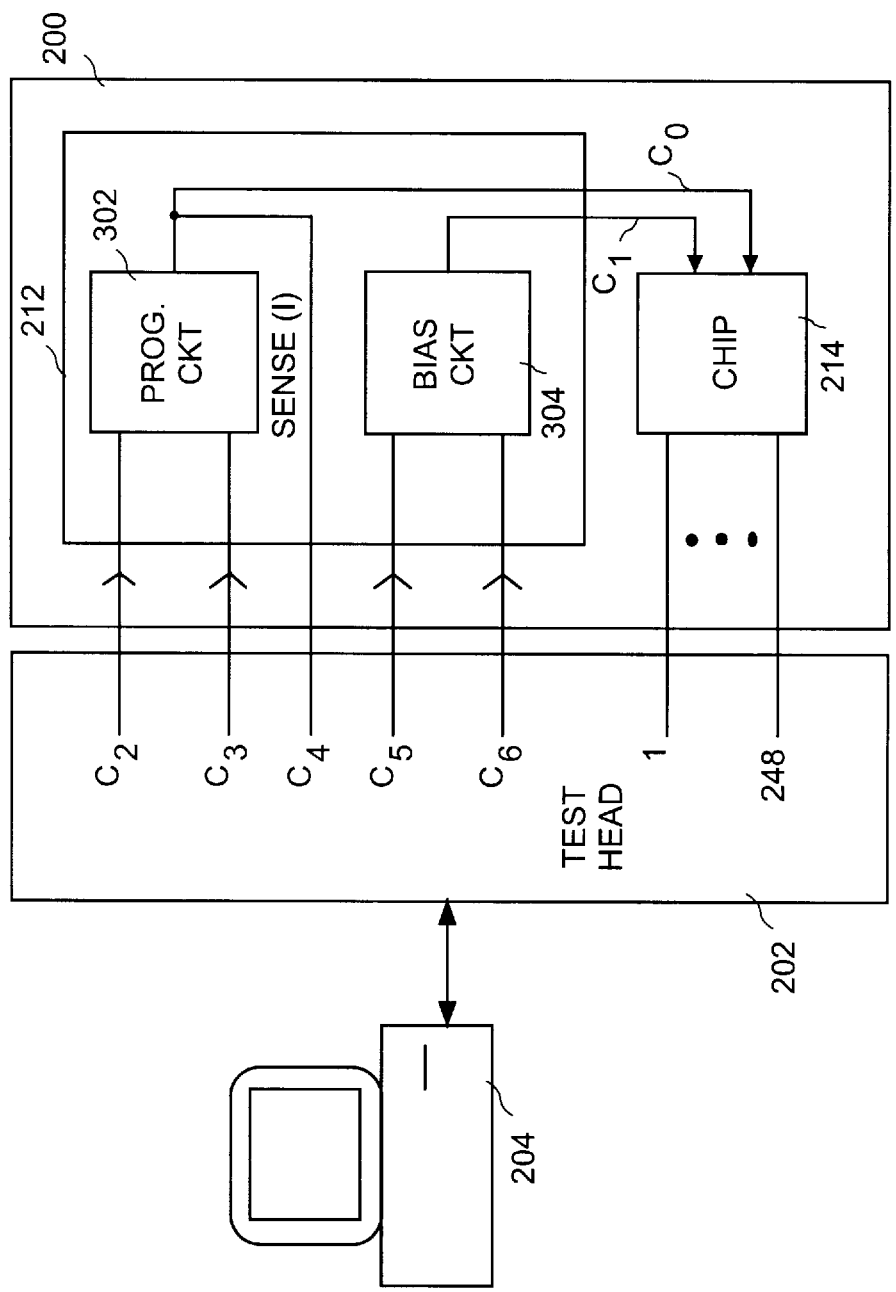
FIG. 3 shows a block diagram of the programming and test circuit that is integrated onto the loadboard in accordance with one embodiment of the present invention.

The test head 202 is generally configured to lie below the X–Y plane of the loadboard 200, such that the pins 216a of the pin cards 216 may be electrically coupled to the test head 202. In this manner, the test head will provide a communication link between the pins 216a of the loadboard 200 and a programming and testing system as shown in FIG. 3 below. Although there may be any number of pins 216a in a particular loadboard 200, an example loadboard may have 256 pins 216a, which couple up to the I/O pins of the chip 214. In this embodiment, only seven pins 216a of a pin card 216' are used for the inventive programming and testing of the present invention. Therefore, more pins 216a will be available to interconnect with a chip having a high I/O pin count.

To accomplish the programming and testing in accordance with one embodiment, a programming and test circuit 212 is directly integrated onto the loadboard 200 in order to substantially simultaneously program and test cells a one-time programmable memory that is integrated into the chip 214. As shown, signals $C_2$, $C_3$, $C_5$, and $C_6$ of a programming vector are communicated by the test head 202 to the loadboard 200, and then communicated to the pins 216a of the pin card 216'. These signals are routed along the loadboard 200 (e.g., via conductive traces), and then communicated to the programming and test circuit 212. A programming signal $C_0$, and a biasing signal $C_1$, are then output from the programming and test circuit 212, and provided as inputs to the chip 214. In one embodiment, the signals $C_1$ and $C_0$ that are output from the programming and test circuit 214 are routed along an under surface of the loadboard 200, and then communicated to the chip 214 via pins of the pin card 216'.

FIG. 3 shows a block diagram of the programming and test circuit 212 that is integrated onto the loadboard 200 in accordance with one embodiment of the present invention. As shown, the programming and test circuit 212 includes a programming sub-circuit 302 and a bias sub-circuit 304. The programming sub-circuit 302 is configured to receive the signal $C_2$ and the signal $C_3$. As shown, signals $C_2$ and $C_3$ are provided from the test head 202. The signals C2, C3, C5, and C6 are configured to communicate selected programming voltages of a programming vector. Further, the test head 202 is typically connected to a programming and testing system 204, where a user may input new or modify existing programming vectors. The output of the programming sub-circuit 302 is provided as an input $C_0$ to the chip 214.

Also provided is a sense signal $C_4$ that is used in voltage compare operations to determine the current flow being passed through a selected memory cell during programming. Generally, the current flow is measured by a current sensing circuit that is part of the programming sub-circuit 302. The current sensing circuit will be described in greater detail below with respect to FIG. 4A. The bias sub-circuit 304 is also shown receiving a signal $C_5$ and a signal $C_6$ of the programming vector. The output of the bias sub-circuit 304 is then provided to the chip as a signal $C_1$. In this embodiment, the programming sub-circuit 302 outputs the signal $C_0$ to program a selected addresses in a vROM device that may be embedded in the chip 214. The output signal $C_1$ of the bias sub-circuit 304 is applied to the chip 214 to produce appropriate biasing voltages during the programming operation of signal $C_0$. In one embodiment, if the chip 214 is a security chip, an internal programming processor, such as an ARM processor is used to select the particular address that will be programmed and tested.

Further shown is a plurality of signals that are configured to access channels 1 through 248 of the chip 214 from the test head 202. In this example, the loadboard 200 will preferably have 256 channels that correspond to each of the pins 216a of the pin cards 216. However, because only one pin card 216' is used for the programming and testing functions, 248 channels will be available for accessing I/O pins of the chip 214. Of course, it should be understood that any number of pins may be provided in larger or smaller loadboards 200, and therefore, larger or smaller chips 214 may benefit from the simultaneous programming and testing of the present invention.

Although any test head 202 may be used, one suitable test head 202 may be a model LT 1101 that is available from Credence, Inc., of Beaverton, Oreg. Preferably, the test head 202 should be well suited to communicate a programming vector to channels $C_2$, $C_3$, $C_5$, and $C_6$ to perform a suitable programming and testing operation.

The programming vector that is provided to the programming and test circuit 212 from the test head 202 is configured to suitably program selected cells of a memory array, and then test the programmed cell to determine whether it was properly programmed before moving to a next cell. More specifically, the testing is performed right after the programming operation and before the next cell is addressed. As mentioned above, in security chip applications, it is important to be able to test whether a programming operation was successful while the particular cell is addressed, because it is generally not possible to re-address the same cell for testing at a later time. This is because security chips usually have an internal programming processor that is configured to randomly produce cell addresses for programming. For these reasons, the programming vector will supply a test pulse voltage that will be applied to the programmed cell to determine if programming was successful.

Figure 4A:
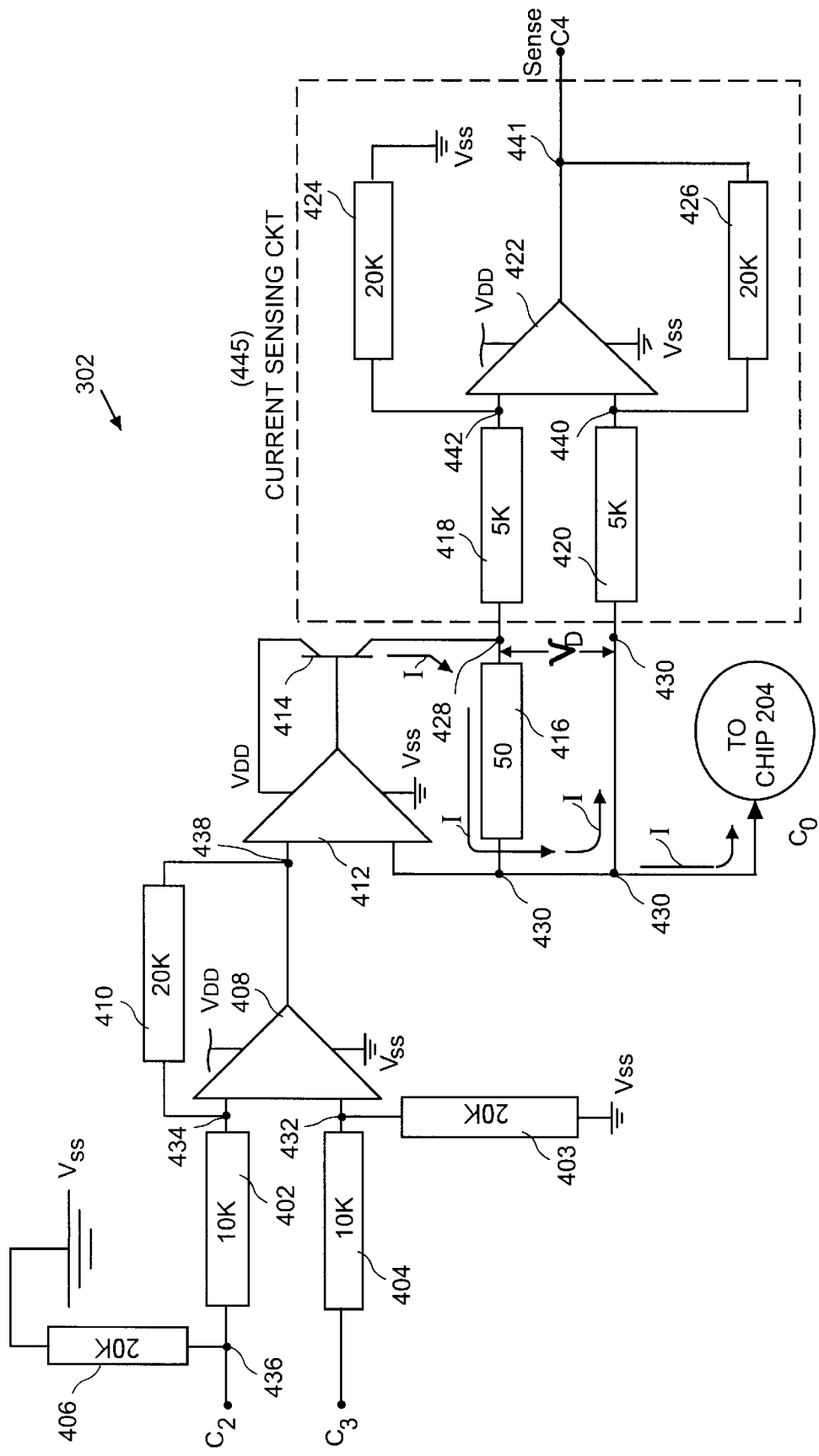
FIG. 4A is a circuit diagram of the programming sub-circuit of FIG. 3 in accordance with one embodiment of the present invention.

FIG. 4A is a circuit diagram of the programming sub-circuit 302 of FIG. 3 in accordance with one embodiment of the present invention. As shown, signal $C_2$ is provided to a node 436 that defines an input to a resistor 402 and a resistor 406. Resistor 406 is then coupled to ground, and resistor 402 is coupled to a node 434. Node 434 therefore defines an input to a differential operational amplifier (Op-Amp) 408. The output of Op-Amp 408 is coupled to a node 438 that has a feedback resistor 410 that is connected back to the node 434.

The signal $C_3$ is passed through a resistor 404 that is coupled to a node 432. A resistor 403 is also shown coupled between the node 432 and ground Vss. Node 432 also defines an input to the differential Op-Amp 408, that is biased between a rail voltage Vdd and a ground voltage Vss. Node 438 also defines an input to an Op-Amp 412. The output of Op-Amp 412 is coupled to a transistor 414 that has its source coupled to a rail voltage Vdd, and its drain coupled to a node 428. Node 428 is shown coupled between a current sensing circuit 445 and a resistor 416 that is coupled to a node 430.

As shown, a current flow (I) will pass across the resistor 416, which is then communicated to the chip 214 as a signal $C_0$. A voltage drop will therefore occur across the resistor 416 and produce a voltage differential "$V_D$" between nodes 428 and 430. This voltage differential will thus be provided as inputs to resistors 418 and 420 of the current sensing circuit 445. Resistor 418 is shown coupled to a differential Op-Amp 422 at a node 442, and resistor 420 is shown coupled to the differential Op-Amp 422 at a node 440. A resistor 424 is shown coupled between ground Vss and node 442, and a resistor 426 is coupled between node 440 and a node 441. Node 441 therefore defines a voltage for the sense signal $C_4$.

In operation, Op-Amp 408 will have a gain factor of "2" that is passed to node 438, which is an input to Op-Amp 412. The output current of transistor 414 is then communicated across the resistor 416, which produces the voltage differential $V_D$ between nodes 428 and 430. This voltage differential is then passed through the Op-Amp 422 that has a gain factor of "4." When a programming vector is provided to the programming sub-circuit 302, the signals $C_2$ and $C_3$ are driven at voltages consistent with the programming vector.

An exemplary programming vector is provided in FIG. 5, which shows the voltages being applied to signals $C_2$ and $C_3$. As shown, a logical "1" High is programmed to be 7 volts for signal $C_2$, and a logical "1" High is programmed to be 6 volts for signal $C_3$. In the second pulse, a logical "0" Low is set to 4 volts for signal $C_2$, and a logical "0" Low is set to 2 volts. The third pulse is set to a logical "1" High at 7 volts, and a logical "0" Low at 2 volts. The next two pulses are marked with an "X," indicating that no voltage levels are being applied to the signals $C_2$ and $C_3$. The last pulse (i.e., the test pulse) of the programming vector is set at a logical "1" High at 7.5 volts for $C_2$, and a logical "1" High is set at 7 volts for a signal $C_3$. As shown, signals $C_2$ and $C_5$, signals $C_3$ and $C_6$ are applied the same voltage level for the programming and test pulses.

When the programming sub-circuit 302 of FIG. 4A receives signals $C_2$ and $C_3$ of the programming vector of FIG. 5, 7 volts is applied to signal $C_2$ and 6 volts is applied to signal $C_3$. As a result, the Op-Amp 408 will produce a 1 volt difference that is multiplied by a gain factor of 2. Therefore, the $C_0$ output signal will be 2 volts. In the second pulse, the voltage level applied to signal $C_2$ is 4 volts, and the voltage level applied to signal $C_3$ is 2 volts, thereby producing a difference of 2 volts. The difference of 2 volts is then multiplied by a gain factor of 2, to produce 4 volts at the output $C_0$. In the third pulse, a voltage of 7 volts is applied to the signal $C_2$, and a voltage of 2 volts is applied to the signal $C_3$. The difference will therefore be 5 volts, that is multiplied by a gain factor of 2 to produce 10 volts at node 438.

As mentioned above, when the programming vector has an X, no voltage is applied, and the resistors 403 and 406 will pull the nodes down to ground. The last pulse of the programming vector of FIG. 5 shows a voltage of 7.5 volts that is applied to signal $C_2$, and a voltage of 7 volts is applied to the signal $C_3$ to produce a difference of 0.5 volts. The 0.5 volt difference is then multiplied by a gain factor of 2 to produce a 1 volt pulse at the output signal $C_0$. The 1 volt pulse is a test pulse that is used to determine whether the programming by the first three pulses of the programming vector caused a selected address of a memory to be properly programmed.

As discussed above, the current sensing circuit 445 will produce a voltage at node 441 that is communicated to the sense signal $C_4$. It is this voltage level that is then compared to determine the amount of current flowing through a selected memory cell during programming and then subsequently, during the test pulse. For example, if the sense signal $C_4$ produces 4 volts, then 20 milli amps will be flowing through the cell being programmed. If 2 volts is produced at the sense signal $C_4$, 10 milli amps will flow through the cell being programmed. If 1 volt is produced at the sense signal $C_4$, then 5 milli amps will be flowing through the cell being programmed.

Figure 6A:
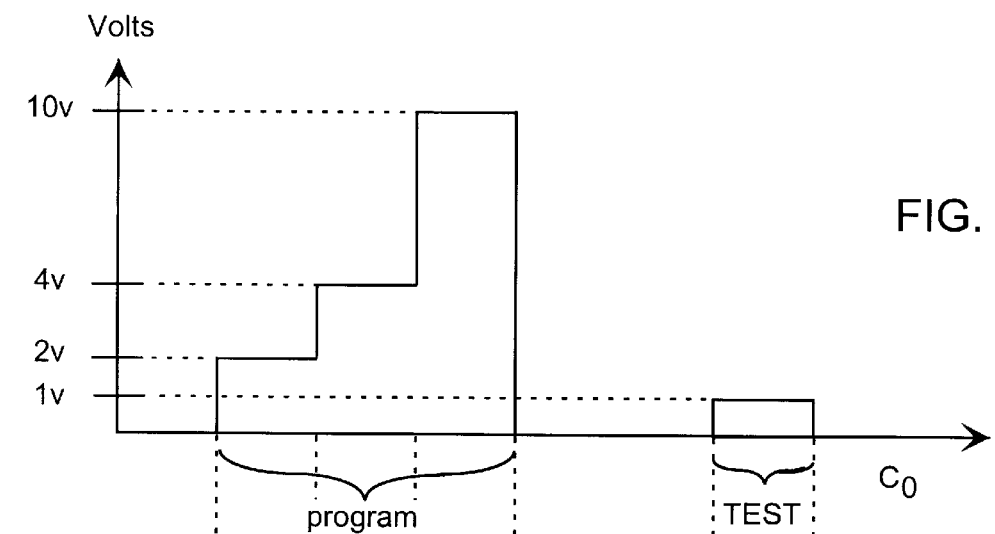
FIGS. 6A through 6C show programming voltage plots and sensed current plots for the programming and testing performed by the programming vector in accordance with one embodiment of the present invention.
Figure 6B:
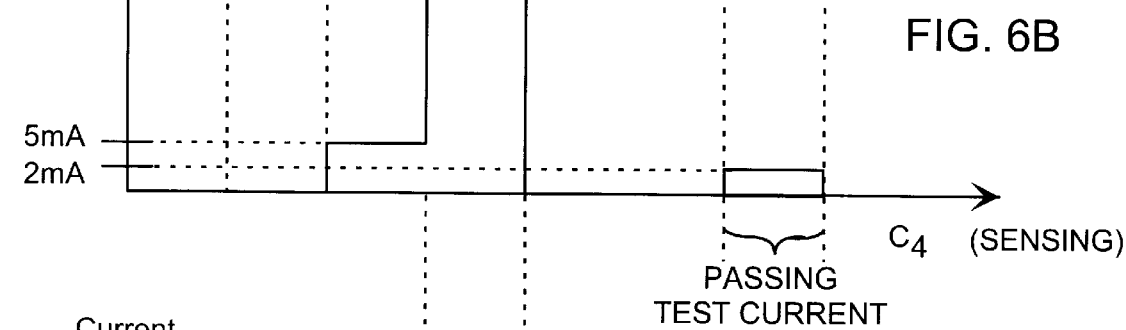
Figure 6C:
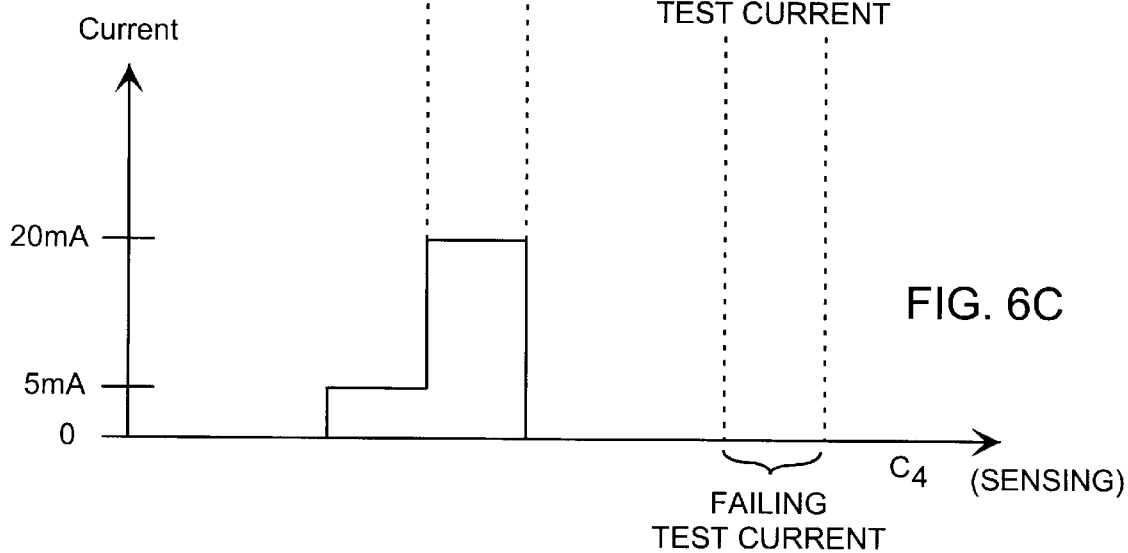

Reference is now drawn to FIGS. 6A through 6C, which show graphical representations of the voltage levels and current levels for the signals of the programming and testing circuit of FIG. 4A in accordance with one embodiment of the present invention. In FIG. 6A, the programming vector of FIG. 5 is plotted in terms of the output voltages being provided to the chip 214 via signal $C_0$. FIG. 6B shows the corresponding current flowing through a cell being programmed by the programming vector of FIG. 5. As shown, when the initial 2 volts is applied to the cell being programmed, almost no current will be flowing through the cell.

When 4 volts is applied to the cell, approximately 5 milli amps is caused to flow through the cell, which therefore initiates the formation of a silicide filament (e.g., in an antifuse cell) in the cell, and thereby enables current to flow through the addressed cell. When 10 volts is applied to the device, about 20 milli amps will begin to flow through the device, and therefore, cause the addressed cell to be programmed. However, to test that appropriate programming has indeed been accomplished, a 1 volt test pulse is applied to the cell to determine whether current will flow through the filament of the programmed cell.

As shown in FIG. 6B, the plotted sensing signal $C_4$ illustrates that about 2 milli amps of current will pass through the addressed cell when the test pulse of 1 volt is applied to the chip 214. When this occurs, this cell may be tagged as a cell that was properly programmed. It should be appreciated that the programming and the testing is completed while the particular cell is still addressed, which enables testing in security chip applications. To illustrate a case in which programming failed, FIG. 6C shows a case where no current is detected by the sensing signal $C_4$, when the test pulse of 1 volt is applied to the chip 214 after programming.

Figure 4B:
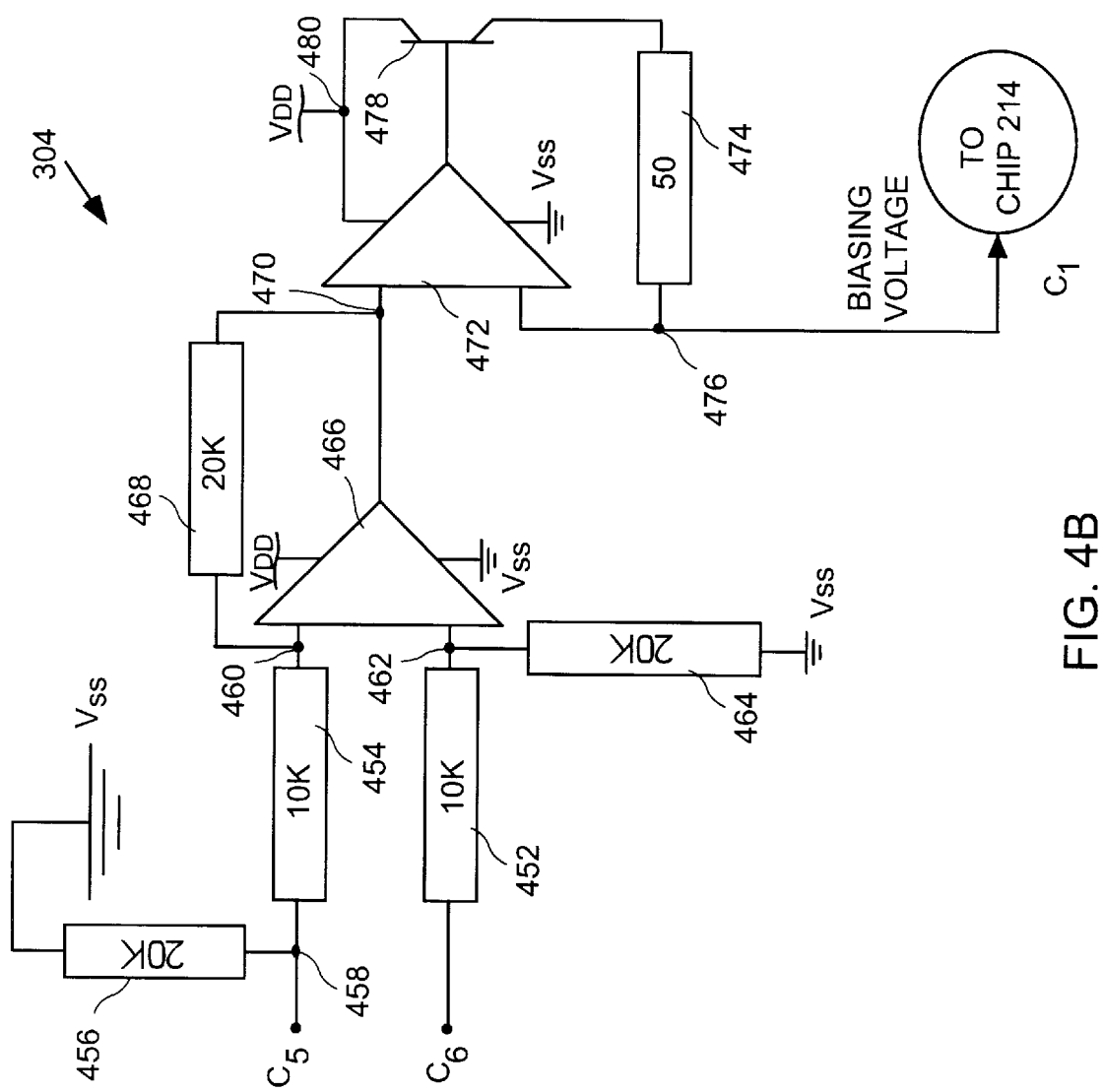
FIG. 4B shows a circuit diagram of the biasing sub-circuit of FIG. 3 in accordance with one embodiment of the present invention.

FIG. 4B shows the biasing sub-circuit 304 that is configured to receive signals $C_5$ and $C_6$. Signal $C_5$ is passed to a node 458 that is connected to a resistor 454 and a resistor 456. Resistor 456 is also tied to ground Vss. A node 460 is shown coupled to the resistor 454 and a feedback resistor 468. Node 460 also defines an input to a differential Op-Amp 466, that has a gain factor of 2.

Signal $C_6$ is shown connected to a resistor 452 that is connected to a node 462. A resistor 464 is shown coupled between the node 462 and ground Vss, and node 462 defines an input to the differential Op-Amp 466. The output of differential Op-Amp 466 is coupled to a node 470 that defines an input to an Op-Amp 472. The output of Op-Amp 472 is connected to a transistor 478 that has its source connected to a node 480, and node 480 is connected to a power rail Vdd. The drain of transistor 478 is then connected to a resistor 474, and a node 476 is connected between an input to the Op-Amp 472. The voltage at node 476 is therefore the biasing voltage $C_1$ that is communicated to the chip 214.

As in FIG. 4A, the programming vector of FIG. 5 is applied to the signals $C_5$ and $C_6$ of the biasing sub-circuit 304. However, it should be understood that any number of programming vectors may be used depending on the type of memory cells being programmed. For example, suitable programming vectors may be custom tailored for programming antifuse cells fabricated in 0.8, 0.6, and smaller micron technologies. In addition, the voltage levels for a logical "1" and a logical "0" may be programmed to have voltages ranging between about −7.5 volts and +15 volts. Therefore, the output voltages $C_0$ and $C_1$ may have output voltages ranging between about 0 volts and 45 volts. Accordingly, the programming vector of Table 5 should only be considered to be one exemplary programming vector that is well suited to simultaneously program and test memory cells on a loadboard 200, using the integrated programming and test circuit 212.

Figure 7:
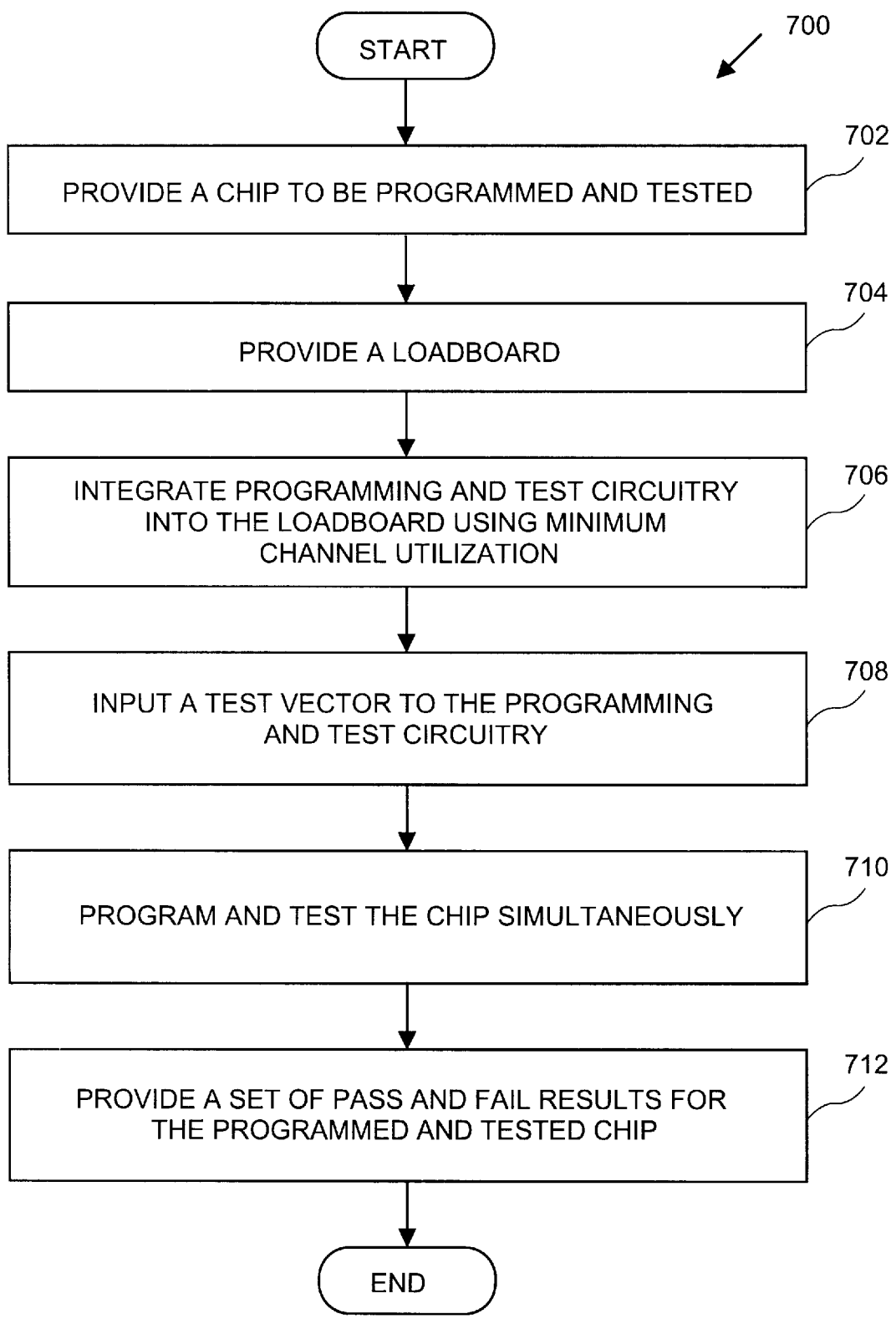
FIG. 7 is a flowchart diagram illustrating the preferred method operations for simultaneously programming and testing a chip on a loadboard in accordance with one embodiment of the present invention.

FIG. 7 is a flowchart diagram 700 illustrating the preferred method operations for simultaneously programming and testing a chip on a loadboard in accordance with one embodiment of the present invention. The method begins at an operation 702 where a chip is provided to be programmed and tested. In general, the chip may either be a dedicated vROM chip that has an array of antifuse cells, or an application specific integrated circuit (ASIC) device having a vROM. In either case, the chip preferably has an internal program processor that is configured to generate random addresses to prevent reverse engineering in security chip applications.

The method then proceeds to an operation 704 where a loadboard is provided. In general, the loadboard may be a large printed circuit board having a receptacle for receiving a chip that is to be programmed and tested, and provides suitable communication to a test head. Once the loadboard is provided in operation 704, the method will proceed to an operation 706 where programming and test circuitry is integrated into the loadboard using a minimum number of channels (i.e., pins 216a). Generally, the programming and test circuitry may either be in the form of an integrated circuit chip that is connected to the loadboard 200, or is in the form of discreet components that are soldered onto the loadboard 200.

Once the programming and test circuitry is integrated into the loadboard, the method will proceed to an operation 708. In operation 708, a programming vector is input to the programming and test circuitry. As shown in FIGS. 3 and 5, the programming vectors are provided to both the programming sub-circuit 302 and the bias sub-circuit 304. Once the programming vector is provided, the method will proceed to an operation 710. In operation 710, the chip is simultaneously programmed and tested while each particular cell is addressed.

By way of example, as shown in FIG. 6A, the programming vector will initially provide a large voltage to cause a filament to form in the antifuse cell, and then provide a test pulse across the cell to determine whether a sufficient amount of current will flow through the programmed cell. Once all cells of the chip have been programmed and test in operation 710, the method will proceed to an operation 712 where a set of pass and fail results for the programmed and tested chip is provided to the user. Once the set of pass and fail results are provided to the user, the method will end.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. A loadboard, comprising:
    a plurality of channel pins being arranged on the loadboard, the plurality of channel pins are electrically routed on the loadboard to a receptacle that is configured to receive I/O pins of an integrated circuit chip; and
    a programming and test circuit is integrated on the loadboard and is coupled to a set of the plurality of channel pins to enable communication with the integrated circuit chip, the programming and test circuit includes a programming sub-circuit for communicating a plurality of voltage levels set by a programming vector to the integrated circuit chip, and a bias sub-circuit for communicating a plurality of bias voltage levels set by the programming vector to the integrated circuit chip.

2. A loadboard as recited in claim 1, wherein the programming sub-circuit includes a current sensing circuit that is configured to perform a voltage compare operation to produce a sense signal, the sense signal is in the form of a sense voltage that indicates a current flow through a memory cell of the integrated circuit chip.

3. A loadboard as recited in claim 2, wherein the plurality of voltage levels include an initial set of voltage levels and a test voltage pulse, such that the initial set of voltage levels cause a current path through the memory cell of the integrated circuit chip.

4. A loadboard as recited in claim 3, wherein the test voltage pulse is monitored by the current sensing circuit to determine if sufficient current is flowing through the current path of the memory cell.

5. A loadboard as recited in claim 2, further comprising:
a test head that electrically connects to the plurality of channel pins of the loadboard.

6. A loadboard as recited in claim 5, wherein the test head is configured to communicate the programming vector to the programming and test circuit.

7. A loadboard as recited in claim 6, wherein a programming and testing system is coupled to the test head.

8. A loadboard as recited in claim 2, wherein the integrated circuit chip is a security chip.

9. A loadboard as recited in claim 8, wherein the security chip includes an internal programming processor for randomly selecting a memory cell for programming and testing.

10. A loadboard as recited in claim 1, wherein the programming sub-circuit includes a programming stage and a current sensing stage, the programming stage includes a first differential operational amplifier having a gain of 2, and a second operational amplifier that is used to produce a voltage differential that is provided to the current sensing stage.

11. A loadboard as recited in claim 10, wherein the voltage differential is measured across a load resistor.

12. A loadboard as recited in claim 11, wherein a programming current is generated across the load resistor, and the current sensing stage measures the programming current.

13. A loadboard as recited in claim 12, wherein the current sensing stage includes a differential amplifier having a gain of 4, and the differential amplifier is configured to receive the voltage differential.

14. A load board as recited in claim 10, wherein the bias sub-circuit includes a differential operational amplifier having a gain of 2, and a second operational amplifier that is used to produce the plurality of bias voltage levels.

15. A method for making a loadboard, comprising:

providing a chip having memory cells that are to be programmed and tested on the loadboard; and integrating a programming and test circuit into the loadboard, the programming and test circuit is configured to communicate a programming vector to a selected one of the memory cells of the chip and testing the selected one of the memory cells while it is still selected, the testing is configured measure whether a suitable current flow occurs through the selected one of the memory cells.

16. A method for making a loadboard as recited in claim 15, wherein the chip is a security chip having an internal programming processor that is configured to randomly address the selected one of the memory cells.

17. A method for making a loadboard as recited in claim 16, wherein the programming vector includes a series of programming voltage pulses and a test pulse.

18. A method for making a loadboard as recited in claim 17, wherein the series of programming voltage pulses and the test pulse are communicated to the selected one of the memory cells before a next cell of the memory cells is randomly selected by the internal programming processor.

19. A method for making a loadboard as recited in claim 18, wherein the memory cells are antifuse cells.

20. A vROM programming and testing system, comprising:

a loadboard having a receptacle for receiving a chip having a vROM memory cells;

a test head that is configured to electrically couple to the loadboard; and a programming and test circuit being integrated on the loadboard, the programming and test circuit includes a programming sub-circuit and a biasing sub-circuit;

whereby the test head transfers a programming vector to the programming and test circuit of the loadboard so that a selected cell of the vROM memory cells is programmed and tested before a next cell of the vROM memory cells is selected.

21. A vROM programming and testing system as recited in claim 20, wherein the chip is a security chip having an internal programming processor that is configured to randomly select cells.

22. A vROM programming and testing system as recited in claim 21, wherein the programming vector includes a series of programming voltage pluses and a test pulse.

23. A vROM programming and testing system as recited in claim 22, wherein the series of programming voltage pulses is configured to form a conductive filament in the selected cell of the vROM memory, and the test pulse is configured to verify whether a sufficient level of current is communicated through the filament of the selected cell.

* * * * *